(12) United States Patent
Wu et al.

(10) Patent No.: US 7,388,236 B2
(45) Date of Patent: Jun. 17, 2008

(54) HIGH EFFICIENCY AND/OR HIGH POWER DENSITY WIDE BANDGAP TRANSISTORS

(75) Inventors: Yifeng Wu, Goleta, CA (US); Primit Parikh, Goleta, CA (US); Umesh Mishra, Montecito, CA (US); Marcia Moore, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 146 days.

(21) Appl. No.: 11/392,114

(22) Filed: Mar. 29, 2006

(65) Prior Publication Data

US 2007/0235775 A1    Oct. 11, 2007

(51) Int. Cl.
*H01L 29/43* (2006.01)
(52) U.S. Cl. .................. 257/194; 257/192; 257/488; 257/E29.14
(58) Field of Classification Search ............... 257/192, 257/194, 488, E29.14
See application file for complete search history.

(56) References Cited

U.S. PATENT DOCUMENTS

| | | | |
|---|---|---|---|
| 4,818,721 A * | 4/1989 | Wang ........................... 438/91 |
| 4,946,547 A | 8/1990 | Palmour et al. |
| 4,956,698 A * | 9/1990 | Wang ........................... 257/609 |
| 5,192,987 A | 3/1993 | Khan et al. |
| 5,196,359 A * | 3/1993 | Shih et al. ................... 438/172 |
| 5,200,022 A | 4/1993 | Kong et al. |
| 5,210,051 A | 5/1993 | Carter, Jr. |
| 5,296,395 A | 3/1994 | Khan et al. |
| RE34,861 E | 2/1995 | Davis et al. |
| 5,393,993 A | 2/1995 | Edmond et al. |
| 5,523,589 A | 6/1996 | Edmond et al. |
| 5,592,501 A | 1/1997 | Edmond et al. |
| 5,686,738 A | 11/1997 | Moustakas |
| 6,020,226 A * | 2/2000 | Cerny et al. ................. 438/167 |
| 6,140,687 A * | 10/2000 | Shimomura et al. ......... 257/401 |
| 6,177,685 B1 * | 1/2001 | Teraguchi et al. ............. 257/20 |
| 6,198,116 B1 * | 3/2001 | Cerny et al. ................. 257/194 |
| 6,218,680 B1 | 4/2001 | Carter, Jr. et al. |
| 6,316,793 B1 | 11/2001 | Sheppard et al. |

(Continued)

FOREIGN PATENT DOCUMENTS

WO    WO 03/049193 A1    6/2003

(Continued)

OTHER PUBLICATIONS

International Search Report and Written Opinion for PCT/US2007/005651; date of mailing Aug. 21, 2007.

(Continued)

*Primary Examiner*—Evan Pert
*Assistant Examiner*—Victor A. Mandala, Jr.
(74) *Attorney, Agent, or Firm*—Myers Bigel Sibley & Sajovec, PA

(57) ABSTRACT

Field effect transistors having a power density of greater than 40 W/mm when operated at a frequency of at least 4 GHz are provided. The power density of at least 40 W/mm may be provided at a drain voltage of 135 V. Transistors with greater than 60% PAE and a power density of at least 5 W/mm when operated at 10 GHz at drain biases from 28 V to 48 V are also provided.

29 Claims, 3 Drawing Sheets

U.S. PATENT DOCUMENTS

| | | | |
|---|---|---|---|
| 6,548,333 | B2 | 4/2003 | Smith |
| 6,586,761 | B2 | 7/2003 | Lowrey |
| 6,841,001 | B2 | 1/2005 | Saxler |
| 6,849,882 | B2 | 2/2005 | Walukiewicz et al. |
| 6,982,204 | B2 | 1/2006 | Saxler et al. |
| 7,030,428 | B2 | 4/2006 | Saxler |
| 7,084,441 | B2 | 8/2006 | Saxler |
| 7,126,426 | B2 | 10/2006 | Mishra et al. |
| 7,161,194 | B2 * | 1/2007 | Parikh et al. ............ 257/194 |
| 7,170,111 | B2 | 1/2007 | Saxler |
| 7,230,284 | B2 | 6/2007 | Parikh et al. |
| 7,238,560 | B2 | 7/2007 | Sheppard et al. |
| 2005/0051796 | A1 | 3/2005 | Parikh et al. |
| 2005/0258451 | A1 | 11/2005 | Saxler et al. |
| 2006/0108606 | A1 | 5/2006 | Saxler et al. |
| 2006/0202272 | A1 | 9/2006 | Wu et al. |

FOREIGN PATENT DOCUMENTS

| | | |
|---|---|---|
| WO | WO 2004/068590 A1 | 8/2004 |
| WO | WO21005/024909 A2 | 3/2005 |
| WO | WO 2005/114744 A2 | 12/2005 |

OTHER PUBLICATIONS

Saito et al. "600V AlGaN/GaN Power-HEMT: Design, Fabrication and Demonstration on High Voltage DC-DC Converter" *International Electron Devices Meeting IEDM* 587-590 (2003).

Ando et al. "10-W/mm AiGaN-GaN HFET with a Field Modulation Plate" *IEEE Electron Device Letters* 24(5):289-291 (2003).

Karmalkar et al. "Enhancement of Breakdown Voltage in AlGaN/GaN High electron Mobility Transistors Using a Field Plate" *IEEE Transactions on Electron Devices* 48(8):1515-1521 (2001).

Khan et al. "High electron mobility transistor based on a GaN-$Al_xGa_{1-x}N$ heterojunction" *Appl. Phys. Lett.* 63(9):1214-1215 (1993).

Palacios et al. "High-Power AlGaN/GaN/GaN HEMTs for Ka-Band Applications" *IEEE Electron Device Letters* 26(11):781-783 (2005).

Saunier, Paul "GaN Technology Overview: Accomplishments and Challenges" *12th GAAS Symposium-Amsterdam* 543-546 (2004).

Thompson et al. "Performance of the AlGaN HEMT Structure with a Gate Extension" *IEEE Transactions on Electron Devices* 51(2):292-295 (2004).

Tilak et al. "Influence of Barrier Thickness on the High-Power Performance of AlGaN/GaN HEMTs" *IEEE Electron Device Letters* 22(11):504-506 (2001).

Wu et al. "Bias-dependent Performance of High-Power AlGaN/GaN HEMTs" *IEDM Tech. Dig.* 378-380 (2001).

Wu et al. "30-W/mm GaN HEMTs by Field Plate Optimization" *IEEE Electron Device Letters* 25(3):117-119 (2004).

Wu et al. "Measured Microwave Power Performance of AlGaN/GaN MODFET" *IEEE Electron Device Letters* 17(9):455-457 (1996).

* cited by examiner

HIGH EFFICIENCY AND/OR HIGH POWER DENSITY WIDE BANDGAP TRANSISTORS

FIELD OF THE INVENTION

The present invention relates to semiconductor devices and, more particularly, to wide bandgap transistors.

BACKGROUND

Materials such as silicon (Si) and gallium arsenide (GaAs) have found wide application in semiconductor devices. These more familiar semiconductor materials may not be well suited for higher power and/or high frequency applications, however, because of their relatively small bandgaps (e.g., 1.12 eV for Si and 1.42 for GaAs at room temperature) and/or relatively small breakdown voltages.

Accordingly, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials typically have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor material transfer to the 2DEG, which may have a high electron mobility due to reduced ionized impurity scattering.

This combination of high carrier concentration and high carrier mobility can give the HEMT a very large transconductance and may provide a strong performance advantage over other transistor structures, such as metal-semiconductor field effect transistors (MESFETs), for high-frequency applications.

High electron mobility transistors fabricated in the gallium nitride/aluminum gallium nitride (GaN/AlGaN) material system have the potential to generate large amounts of RF power, because of the combination of material characteristics that includes the aforementioned high breakdown fields, wide bandgaps, large conduction band offset, and/or high saturated electron drift velocity. A major portion of the electrons in the 2DEG is attributed to polarization in the AlGaN.

HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Wide bandgap GaN-based high-electron-mobility-transistors (HEMTs) have come a long way as microwave devices since their description in 1993 in Khan et al., Appl. Phys. Lett., vol. 63, p. 1214, 1993, and a demonstration of their power capability in 1996 in Wu et al., IEEE Electron Device Lett., vol. 17, pp. 455-457, September, 1996. Many research groups have presented devices with power densities exceeding 10 W/mm, a ten-fold improvement over conventional III-V devices. See Tilak et al., IEEE Electron Device Lett., vol. 22, pp. 504-506, November, 2001; Wu et al., IEDM Tech Dig., Dec. 2-5, 2001, pp. 378-380; and Ando et al., IEEE Electron Device Lett., vol. 24, pp. 289-291, May, 2003.

An overlapping gate structure, or field plate, was used by Zhang et al. with GaN HEMTs for high-voltage switching applications. Zhang et al., IEEE Electron Device Lett., vol. 21, pp. 421-423, September, 2000. Following this, Karmalkar et al. performed simulations for the field plate structure, predicting up to five times enhancement in breakdown voltages. Karmalkar et al., IEEE Trans. Electron Devices, vol. 48, pp. 1515-1521, August, 2001. However, fabricated devices at that time had low cutoff frequencies, and were not suitable for microwave operation. Ando et al. recently used a similar structure with smaller gate dimensions and demonstrated performance of 10.3 W output power at 2 GHz using a 1-mm-wide device on a SiC substrate. Ando et al., IEEE Electron Device Lett., vol. 24, pp. 289-291, May, 2003. Chini et al. implemented a new variation of the field-plate design with further reduced gate dimensions, and obtained 12 W/mm at 4 GHz from a 150-μm-wide device on a sapphire substrate. Chini et al., IEEE Electron Device Lett., vol. 25, No. 5, pp. 229-231, May, 2004.

GaN HEMT devices including source-connected field plates are described in W. Saito et al., Technical Digest of IEDM 2003, pp. 587-590, Washington, D.C., Dec. 8-10, 2003. In the devices described by Saito et al., a single metal field plate extends from the source and overlaps the gate. However, such a configuration may impose large parasitic capacitances.

SUMMARY OF THE INVENTION

A field effect transistor according to some embodiments of the invention includes a Group III-nitride channel layer, and a gate contact on the Group III-nitride channel layer and configured to modulate a conductivity of the channel layer when a voltage is applied to the gate contact. The gate contact may have a length configured to permit modulation of the conductivity of the channel layer at frequencies exceeding 1 GHz. Source and drain contacts are on the Group III-nitride channel layer, an insulating layer is on the gate contact, and a field plate is on the insulating layer and is electrically coupled to the source contact. The field effect transistor may exhibit a power density of greater than 40 W/mm under continuous wave or pulsed operation at a frequency of at least 4 GHz.

The field effect transistor may further include a Group III-nitride barrier layer on the channel layer. The gate contact may be on the barrier layer, and the barrier layer and the channel layer may cooperatively induce a two-dimensional electron gas in the channel layer near an interface between the barrier layer and the channel layer.

The barrier layer may include a first barrier sublayer on the channel layer and a second barrier sublayer on the first barrier sublayer. The first barrier sublayer may include AlN and the second barrier sublayer may include $Al_xGa_{1-x}N$, wherein $0.15 \leq x \leq 0.45$.

If present, the first barrier sublayer may have a thickness of up to about 4 nm, and the second barrier sublayer may have a thickness of about 10 to about 50 nm.

The channel layer may include a first channel sublayer and a second channel sublayer on the first channel sublayer. The first channel sublayer may include GaN and may have a concentration of Fe dopants of at least about $1 \times 10^{17}/cm^3$. The second channel sublayer may include GaN and may have a concentration of Fe dopants therein that decreases with distance from the first channel sublayer.

The field plate may be an upper field plate, and the field effect transistor may further include a spacer layer on the barrier layer, and a lower field plate electrically connected to the gate and extending across the spacer layer from a drain side of the gate contact toward the drain contact by a distance $L_{FD1}$. The upper field plate may extend across the insulating layer at least from a drain side edge of the lower field plate towards the drain contact by a distance $L_{FD2}$. For operation in the 1-6 GHz range, $L_{FD1}+L_{FD2}$ may be about 1-2.5 µm. In particular, $L_{FD1}$ may be about 0.5 µm and $L_{FD2}$ may be about 1.2 µm.

The lower field plate may also extend across the spacer layer toward the source contact by a distance of from about 0 µm to about 0.5 µm. The spacer layer may include SiN.

The power density of at least 40 W/mm may be provided at a drain voltage of 135 V. The field effect transistor may have a power added efficiency (PAE) greater than 50%.

Some embodiments of the invention provide a field effect transistor having a power density of greater than 40 W/mm under continuous wave or pulsed operation at a frequency of at least 4 GHz. The power density of at least 40 W/mm may be provided at a drain voltage of 135 V, and the field effect transistor may have a PAE greater than 50%.

Some embodiments of the invention provide a field effect transistor including a Group III-nitride channel layer, and a gate contact on the Group III-nitride channel layer and configured to modulate a conductivity of the channel layer when a voltage is applied to the gate contact. The gate contact may have a length configured to permit modulation of the conductivity of the channel layer at frequencies exceeding 1 GHz. Source and drain contacts are on the Group III-nitride channel layer, an insulating layer is on the gate contact, and a field plate is on the insulating layer and is electrically coupled to the source contact. The field effect transistor may exhibit a power density of greater than 5 W/mm and power added efficiency greater than 60% under continuous wave or pulsed operation at a frequency of at least 10 GHz.

The field effect transistor may further include a Group III-nitride barrier layer on the channel layer. The gate contact may be on the barrier layer, and the barrier layer and the channel layer may cooperatively induce a two-dimensional electron gas in the channel layer near an interface between the barrier layer and the channel layer.

The barrier layer may include a first barrier sublayer on the channel layer and a second barrier sublayer on the first barrier sublayer. The first barrier sublayer may include AlN and the second barrier sublayer may include $Al_xGa_{1-x}N$, wherein $0.15 \leq x \leq 0.45$.

If present, the first barrier sublayer may have a thickness of up to about 4 nm, and the second barrier sublayer may have a thickness of about 10 to about 50 nm.

The channel layer may include a first channel sublayer and a second channel sublayer on the first channel sublayer. The first channel sublayer may include GaN and may have a concentration of Fe dopants of at least about $1 \times 10^{17}/cm^3$. The second channel sublayer may include GaN and may have a concentration of Fe dopants therein that decreases with distance from the first channel sublayer.

The field plate may be an upper field plate, and the field effect transistor may further include a spacer layer on the barrier layer, and a lower field plate electrically connected to the gate and extending across the spacer layer from a drain side edge of the gate contact toward the drain contact by a distance $L_{FD1}$. The upper field plate may extend across the insulating layer at least from a drain side edge of the lower field plate towards the drain contact by a distance $L_{FD2}$. $L_{FD1}+L_{FD2}$ may be about 0.3-1.0 µm. In particular, $L_{FD1}$ may be about 0.25 µm and $L_{FD2}$ may be about 0.3 µm.

The lower field plate may also extend across the spacer layer toward the source contact by a distance of from about 0 µm to about 0.5 µm. The spacer layer may include SiN.

The power density of at least 5 W/mm may be provided at a drain voltage of 28 V.

Some embodiments of the invention provide a field effect transistor having a power density of greater than 5 W/mm and power added efficiency greater than 60% under continuous wave or pulsed operation in Class C mode at a frequency of at least 10 GHz.

The power density of greater than 5 W/mm may be provided at a drain voltage of at least 28 V.

The field effect transistor may have a power density of greater than 7 W/mm when operated in Class C mode at a frequency of at least 10 GHz. The power density of greater than 7 W/mm may be provided at a drain voltage of at least 38 V.

The field effect transistor may have a power density of greater than 10 W/mm when operated in Class C mode at a frequency of at least 10 GHz. The power density of greater than 10 W/mm may be provided at a drain voltage of at least 48 V.

Transistors having various combinations and/or sub-combinations of transistor characteristics described above may also be provided according to some embodiments of the present invention.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
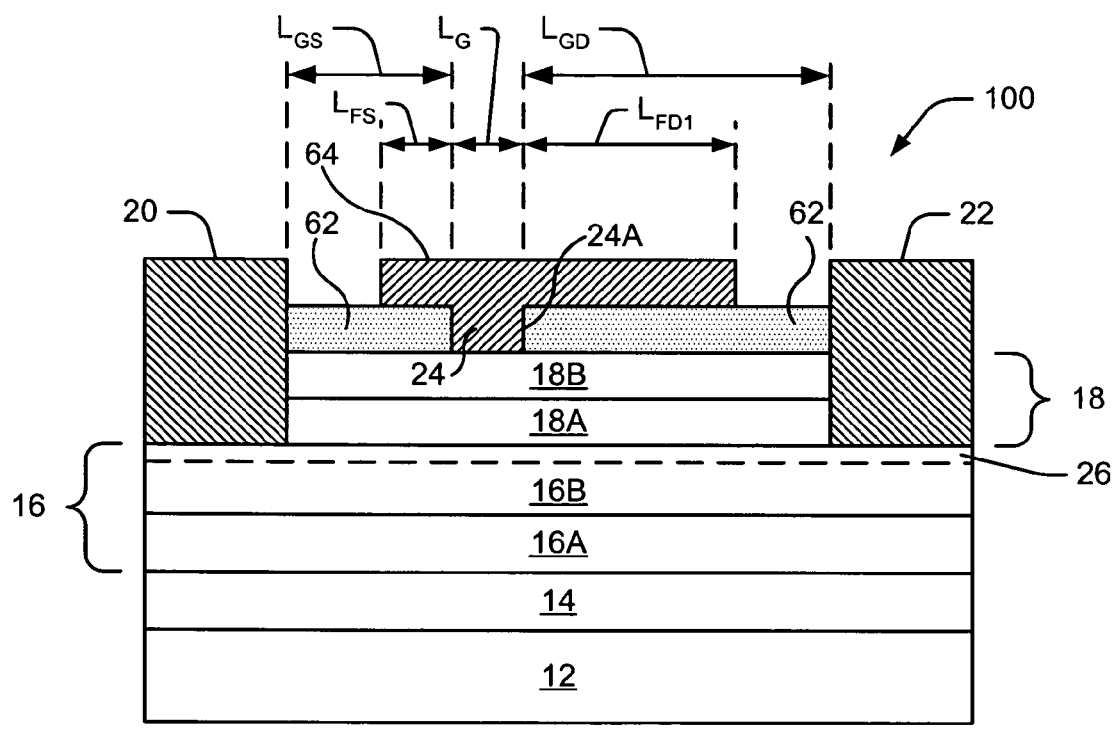
FIG. 1 is a cross-sectional diagram of a transistor having a single filed plate structure according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section-illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the present invention may be particularly well suited for use in nitride-based devices such as Group III-nitride based HEMTs. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

While embodiments of the present invention are described with reference to particular structures, other structures and/or techniques for fabricating GaN-based HEMTs could also be utilized in some embodiments of the present invention. Such structures and/or techniques may include those described, for example, in commonly assigned U.S. Pat. No. 6,316,793 and U.S. Patent Publication No. 2002/0066908A1 filed Jul. 12, 2001 and published Jun. 6, 2002, for "Aluminum Gallium Nitride/Gallium Nitride High Electron Mobility Transistors Having a Gate Contact on a Gallium Nitride Based Cap Segment and Methods of Fabricating Same," U.S. Patent Publication No. 2002/0167023A1 to Smorchkova et al., published Nov. 14, 2002, entitled "Group-III Nitride Based High Electron Mobility Transistor (HEMT) With Barrier/Spacer Layer", U.S. patent application Ser. No. 10/617,843 filed Jul. 11, 2003 for "Nitride-Based Transistors and Methods of Fabrication Thereof Using Non-Etched Contact Recesses," U.S. patent application Ser. No. 10/772,882 filed Feb. 5, 2004 for "Nitride Heterojunction Transistors Having Charge-Transfer Induced Energy Barriers And Methods Of Fabricating The Same," U.S. patent application Ser. No. 10/897,726, filed Jul. 23, 2004 entitled "Methods Of Fabricating Nitride-Based Transistors With A Cap Layer And A Recessed Gate," U.S. patent application Ser. No. 10/849,617, filed May 20, 2004 entitled "Methods Of Fabricating Nitride-Based Transistors Having Regrown Ohmic Contact Regions And Nitride-Based Transistors Having Regrown Ohmic Contact Regions," U.S.

patent application Ser. No. 10/849,589, filed May 20, 2004 and entitled "Semiconductor Devices Having A Hybrid Channel Layer, Current Aperture Transistors And Methods Of Fabricating Same," U.S. Patent Publication No. 2003/0020092 filed Jul. 23, 2002 and published Jan. 30, 2003 for "Insulating Gate AlGaN/GaN HEMT", and U.S. patent application Ser. No. 10/996,249, filed Nov. 23, 2004 and entitled "Cap Layers and/or Passivation Layers for Nitride-Based Transistors, Transistor Structures and Methods of Fabricating Same," the disclosures of which are incorporated herein as if described in their entirety.

Some embodiments of the present invention provide wide bandgap field effect transistors having a power density of greater than 40 W/mm at a frequency of at least 4 GHz. Furthermore, the transistors may provide a power added efficiency (PAE) of a least 60% at 4 GHz and/or at least 60% at 10 GHz. In some embodiments, the power density and/or PAE are obtained with a compression of not greater than 3 dB.

Some embodiments of the invention provide wide bandgap field transistors having dual field plate configurations in which a second field plate is connected to the source contact of the transistor. Such transistors may have improved power capability and reduced gate-to-drain feedback capacitance.

Figure 2:
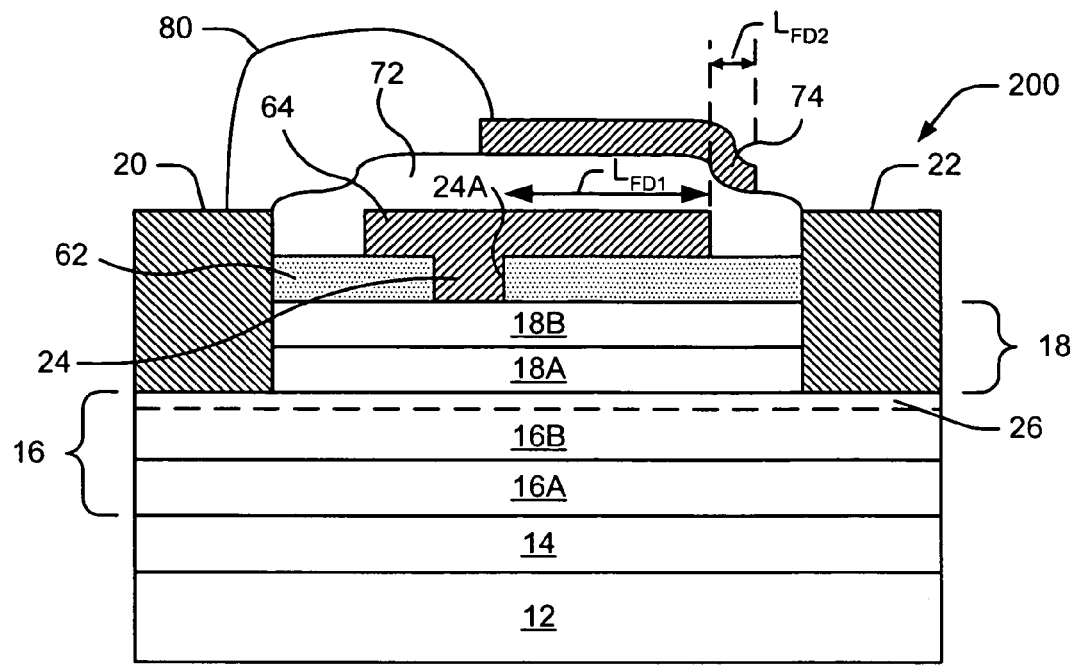
FIG. 2 is a cross-sectional diagram of a transistor having a dual field plate structure according to some embodiments of the present invention.
Figure 3:
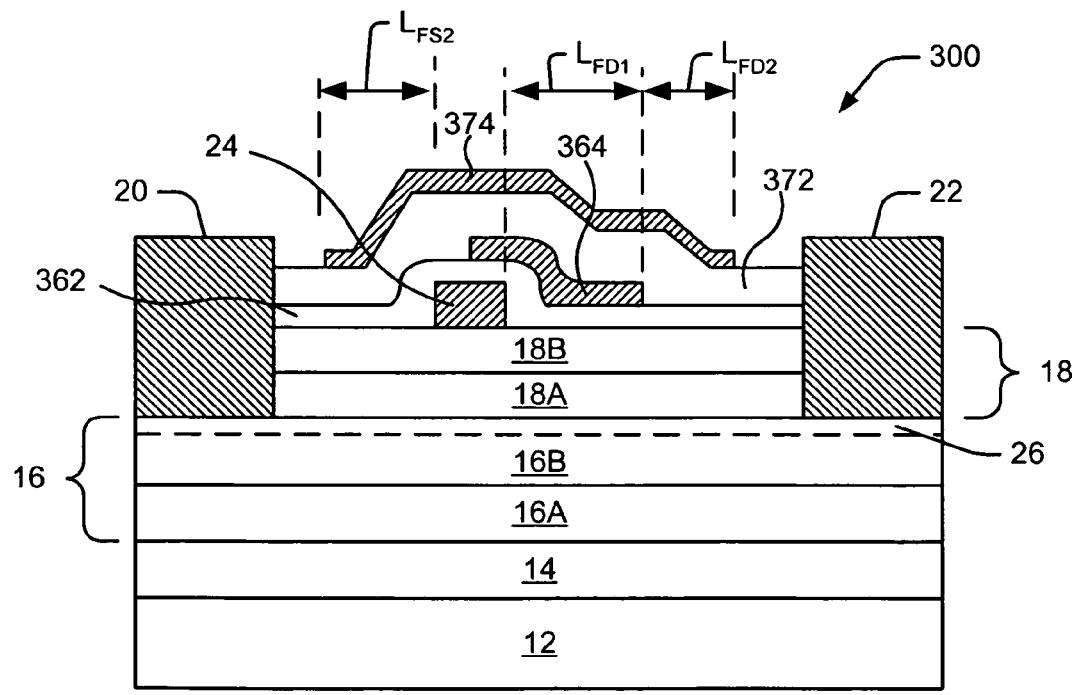
FIG. 3 is a cross-sectional diagram of a transistor having a dual field plate structure according to further embodiments of the present invention.

Exemplary devices according to some embodiments of the present invention are schematically illustrated in FIGS. 1-3. However, embodiments of the present invention should not be construed as limited to the particular exemplary embodiments described herein but may include any suitable structure that provides transistor characteristics as described herein.

Turning to FIG. 1, a partial HEMT device structure 10 having a single field plate structure is illustrated. The structure 100 includes a substrate 12 on which nitride-based devices may be formed. In particular embodiments of the present invention, the substrate 12 may be a semi-insulating silicon carbide (SiC) substrate that may be, for example, a 4H polytype of silicon carbide. Other silicon carbide candidate polytypes include the 3C, 6H, and 15R polytypes. The term "semi-insulating" is used in a relative sense. In particular embodiments of the present invention, the silicon carbide bulk crystal has a resistivity equal to or higher than about $1 \times 10^5$ Ω-cm at room temperature.

An AlN buffer layer 14 may be provided to provide an appropriate crystal structure transition between the silicon carbide substrate and the remainder of the device. The buffer layer 14 may have a thickness of from about 100 nm to about 500 nm. In particular embodiments, the buffer layer 14 may have a thickness of about 200 nm.

Additional buffer layers, transition layers, and/or nucleation layers as described above by be provided between the substrate 12 and the channel layer 16. For example, strain balancing transition layer(s) may also be provided as described, for example, in commonly assigned U.S. Patent Publication No. 2003/0102482A1, filed Jul. 19, 2002 and published Jun. 5, 2003, and entitled "Strain Balanced Nitride Heterojunction Transistors And Methods Of Fabricating Strain Balanced Nitride Heterojunction Transistors," or United States Patent Publication No. 2004/0012015 A1, filed Jul. 19, 2002 and published Jan. 22, 2004, and entitled "Strain Compensated Semiconductor Structures And Methods Of Fabricating Strain Compensated Semiconductor Structures," the disclosures of which are incorporated herein by reference as if set forth fully herein.

Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, a buffer layer appropriate to the type of substrate used may also be formed. For example, in embodiments where a sapphire substrate is used, the buffer may be formed as provided in U.S. Pat. No. 5,686,738.

Still referring to FIG. 1, a channel layer 16 is provided on the buffer layer 14. The channel layer 16 may be under compressive strain. Furthermore, the channel layer 16, the buffer layer 14 and/or nucleation and/or transition layers may be deposited by MOCVD or by other techniques known to those of skill in the art, such as MBE or HVPE.

In some embodiments of the present invention, the channel layer 16 includes a Group III-nitride, and, in particular includes GaN. The channel layer 16 may be undoped ("unintentionally doped") and/or doped with a dopant, and may be grown to a thickness of greater than about 20 Å. In particular embodiments of the present invention, the channel layer 16 is GaN and has a thickness of about 1.6 μm.

As shown in FIG. 1, the channel layer 16 may include a first channel sublayer 16A formed on the buffer layer 14 and a second channel sublayer 16B formed on the first channel sublayer 16A. The first channel sublayer 16A may have a thickness of about 0.1-8.0 μm. The first channel sublayer 16A may be doped with Fe at a concentration of at least about $1 \times 10^{17}/cm^3$, and in particular may have a Fe concentration of about $1 \times 10^{18}/cm^3$.

A metalorganic source gas such as Ferrocene may be used as a source gas for providing the Fe dopants when forming the first channel sublayer 16A using chemical vapor deposition. When the Fe source gas is switched off after the growth of the first channel sublayer 16A is complete, some residual Fe may become incorporated into subsequently grown layers. That is, some of the Fe source material may remain in the growth system even after the Fe source gas is switched off, which may cause the concentration of Fe in the epitaxial layers to decrease relatively slowly after the source is switched off. Accordingly, a second channel sublayer 16B may be provided on the first channel sublayer 16A. The second channel sublayer 16A may have a thickness of about 0.2-2.0 μm, and may be unintentionally doped. However, as noted above, the second channel sublayer 16B may include a concentration of Fe dopants that decreases with distance from the first channel sublayer 16A.

In particular embodiments, the first channel sublayer 16A has a thickness of about 0.8 μm, and the second channel sublayer 16B has a thickness of about 0.8 μm.

A barrier layer 18 is provided on the channel layer 16. The barrier layer 18 may have a bandgap that is larger than the bandgap of the channel layer 16, and the barrier layer 18 may also have a smaller electron affinity than the channel layer 16.

The barrier layer 18 may be formed on the channel layer 16. In certain embodiments of the present invention, the barrier layer includes a first barrier sublayer 18A on the channel layer 16 and a second barrier sublayer 18B on the first barrier sublayer 18A. The first barrier sublayer 18A may include AlN and may have a thickness of up to about 4 nm. The second barrier sublayer 18B may include $Al_xGa_{1-x}N$ and may have a thickness of about 10-50 nm. The second barrier 18B may have a mole fraction of aluminum of about 15%-45% (i.e. $0.15 \leq x \leq 0.45$). In particular embodiments, the first barrier sublayer 18A may be about 0.8 nm thick. The second barrier sublayer 18B may have a thickness of about 25 nm and may have a mole fraction of aluminum of about 25% (i.e. x~0.25).

Examples of barrier layers according to certain embodiments of the present invention are described in U.S. Patent Publication No. 2002/0167023A1, to Smorchkova et al., entitled "Group-III Nitride Based High Electron Mobility Transistor (HEMT) With Barrier/Spacer Layer" the disclosure of which is incorporated herein by reference as if set forth fully herein.

In particular embodiments of the present invention, the barrier layer 18 is thick enough and has a high enough Al composition and doping to induce a significant carrier concentration at the interface between the channel layer 16 and the barrier layer 18 through polarization effects.

A gate contact 24 is provided on the barrier-layer 18. Source and drain contacts 20 and 22 are provided as ohmic contacts on and/or extending through the barrier layer 18. Ohmic contacts are processed (e.g., by sintering) to have a low resistivity connection through the barrier layer 18 to the channel layer 16. For example, the source and drain contacts 20, 22 may be formed on the barrier layer 18 by electron beam evaporation and may be annealed, for example, at about 880° C. Thus, as shown in FIG. 1, after processing, the ohmic contacts 20 and 22 may extend through the barrier layer 18 to the channel layer 16. Electric current may flow between the source and drain contacts 20, 22 through a 2DEG channel 26 induced in the channel layer 16 near the interface between the channel layer 16 and the barrier layer 18 when the gate 24 is biased at an appropriate level with respect to the source 20.

The gate 24 may be formed, for example, using electron beam evaporation, and may include a Ni/Au structure having a layer of nickel about 50-500 nm thick and a layer of gold about 100-1000 nm thick. In particular embodiments, the gate 24 may include about 20 nm of nickel and about 450 nm of gold.

The gate 24 may have a gate length $L_G$ of about 0.35-2.0 μm (for operation in the 20 GHz to 1 GHz range). In particular, for operation at 4 GHz, the gate 24 may have a gate length $L_G$ of about 0.55 μm. For operation at 10 GHz, the gate 24 may have a gate length $L_G$ of about 0.5 μm. Gate length ($L_G$) affects the transit time of carriers under the gate, which in turn affects the operating frequency of the device.

A non-conducting first spacer layer 62 is provided on the barrier layer 18 between the gate 24 and the source and drain contacts 20, 22. The first spacer layer 62 may include $Si_xN_y$ ($2 \leq x \leq 4$, $3 \leq y \leq 5$) having a thickness of about 50-300 nm. In particular embodiments, the first spacer layer 62 may include a layer of $Si_3N_4$ having a thickness of about 200 nm.

The first spacer layer 62 can be formed before device metallization, and in some embodiments can be grown using the same epitaxial growth techniques as were used to form the barrier layer 18. The first spacer layer 62 may include an epitaxial material such as a Group III-nitride material having different Group III elements such as alloys of Al, Ga, or In, with a suitable spacer layer material being $Al_xGa_{1-x}N$ ($0 \leq x \leq 1$). Alternatively, the spacer layer 62 may include $Si_xN_y$, $SiO_2$, Si, Ge, $MgO_x$, $MgN_x$, ZnO, alloys and/or layer sequences thereof. References to SiN, SiON, $SiO_x$, $MgN_x$ and the like refer to stoichiometric and/or non-stoichiometric materials.

The first spacer layer 62 is arranged to provide isolation between a first field plate 64 and the barrier layer 18, so the first spacer layer 62 need only cover the barrier layer 18 below the first field plate 62. For ease of manufacturing, however, the first spacer layer 62 may be formed on the entire upper surface of the barrier layer 18.

The first spacer layer 62 may then be selectively etched to provide an opening for the gate 24. Openings may also be etched for the source contact 20 and the drain contact 22. During metallization, the gate 24 may be formed to be in electrical contact with the barrier layer 18.

The first field plate 64 may be formed integral to the gate 24 and may extend on the spacer layer 62 a distance $L_{FD1}$ in the range of 1 to 2.5 μm from a drain side edge of the gate 24 toward the drain contact 22 for operation at 1-6 GHz. For operation at 10 GHz, the first field plate 64 may extend toward the drain contact 22 a distance $L_{FD1}$ in the range of 0.2-0.6 μm. The first field plate 64 may extend a distance $L_{FS}$ in the range of 0 to 0.5 μm from a source side edge of the gate 24 toward the source contact 20. In particular embodiments, for operation in the 1-6 GHz range, the first field plate 64 may extend a distance $L_{FD1}$ of about 1 μm toward the drain contact 22 and a distance $L_{FS}$ of about 0.3 μm toward the source contact 20. For operation in the 10 GHz range, the first field plate 64 may extend a distance $L_{FD1}$ of 0.25 μm towards the drain contact 22.

The first field plate 64 may be electrically connected to the gate 24, for example, by its integral formation with the gate 24. The first field plate 64 can extend continuously from the gate 24 or can have breaks/holes in the connection with the gate 24 on either the source or drain side of the gate contact 24, or both, as long as enough conductive paths are available to effectively spread current between the gate 24 and the first field plate 64.

Since the first field plate 64 may be formed integral with the gate 24, the first field plate 64 may be formed, for example, using electron beam evaporation, and may include a Ni/Au structure having a layer of nickel about 50-500 nm thick and a layer of gold about 100-1000 nm thick. In particular embodiments, the first field plate 64 may include about 20 nm of nickel and about 450 nm of gold.

The source and drain ohmic contacts can be made of different materials including but not limited to alloys of titanium, aluminum, gold or nickel. The gate 24 and first field plate 64 can also be made of different materials including but not limited to gold, nickel, platinum, titanium, chromium, alloys of titanium and tungsten, or platinum silicide.

Transistors with field plates and methods of fabricating such transistors are described, for example, in U.S. patent application Ser. No. 11/078,265 filed Mar. 11, 2005 and entitled "Wide Bandgap Transistors With Gate-Source Field Plates", U.S. patent application Ser. No. 10/930,160, filed Aug. 31, 2004 and entitled "Wide Bandgap Transistor Devices With Field Plates", U.S. patent application Ser. No. 10/856,098, filed May 28, 2004 and entitled "Cascode Amplifier Structures Including Wide Bandgap Field Effect Transistor With Field Plate" and International Application Number PCT/US04/29324, filed Sep. 9, 2004 and entitled "Fabrication Of Single Or Multiple Gate Field Plates," the disclosures of which are incorporated herein by reference as if set forth in their entirety.

The dimension of the gate contact 24 extending in a direction transverse to the gate length (i.e. into and out of the page in FIG. 1) is referred to herein as the gate width $W_G$. Power density is a normalized device characteristic that permits comparisons across different size devices. Power density is defined as power output in watts per millimeter of gate width, or W/mm.

Referring to FIG. 2, a transistor structure 200 having a dual field plate structure is illustrated. The second transistor structure 200 includes elements and features similar to the first transistor structure 100 shown in FIG. 1. For example, the second transistor structure 200 includes a buffer layer 14, a channel layer 16 and a barrier layer 18 formed sequentially on a substrate 12. The substrate 12, buffer layer 14, channel layer 16 and barrier layer 18 of the second transistor structure 200 may be formed as described above with reference to the first transistor structure 100.

The second transistor structure 200 includes a first spacer layer 62 on the barrier layer 18. However, in the second transistor structure, however, the first spacer layer 62 may have a thickness of about 50-200 nm, and in particular may have a thickness of about 100 nm.

The second transistor structure 200 also includes a gate 24 with an integrated first field plate 64. The gate 24 and the first field plate 64 may be formed as described above. However, in the second transistor structure 200, the first field plate 64 may extend a distance $L_{FD1}$ of about 0.5 μm towards the drain contact 22.

The second transistor structure 200 includes a dual field plate structure. In particular, a second non-conducting spacer layer 72 may be formed on the first field plate 64 and the first spacer layer 62. The second spacer layer 72 may include SiN, $SiO_2$, Si, Ge, $MgO_x$, $MgN_x$, ZnO, alloys and/or layer sequences thereof. The second spacer layer 72 may be formed by sputter deposition, plasma-enhanced chemical vapor deposition (PECVD) or by other processes. The second spacer layer 72 can be formed of the same material or layers of material as the first spacer layer 62 and can have a total thickness in the range of 50 to 200 nm. In particular embodiments, the second spacer layer 72 may include $Si_3N_4$ and may have a thickness of about 100 nm.

A second field plate 74 may overlap the gate as shown in FIG. 2. Alternatively, there may be a space between the edge 24A of the gate 24 and the starting edge of the second field plate 74. The second field plate 74 extends from the drain-side edge of the first field plate 64 towards the drain contact 22 by a distance $L_{FD2}$ which can be in the range of 1.0-2.0 μm in order to obtain a high power density (e.g. 40 W/mm) at 1-6 GHz. For operation at 10 GHz, $L_{FD2}$ may have a range of 0.3-1.0 μm. In particular embodiments for operation at 1-6 GHz, the second field plate 74 extends toward the drain contact 22 by a distance $L_{FD2}$ of about 1.2 μm, and the total length of the first and second field plates 64, 74, $L_{FD1}+L_{FD2}$, is about 1-2.5 μm. For 10 GHz operation, the total length of the first and second field plates 64, 74, $L_{FD1}+L_{FD2}$, is about 0.5-1.0 μm. In particular embodiments, for operation at 10 GHz, $L_{FD1}=0.25$ μm and $L_{FD2}=0.3$ μm.

The second spacer layer 72 provides electrical isolation between the first field plate 64 and the second field plate 74. Accordingly, the second spacer layer 72 may cover at least enough of the first field plate 64 to provide such electrical isolation.

The second field plate 74 may be electrically connected to the source contact 20 via a connection 80 illustrated schematically in FIG. 2. Alternatively, the second field plate 74 may be electrically connected to the gate 24. Many different connection structures may be used. For example, conductive buses (not shown) may be used to connect the second field plate 74 to the source contact 20 or the gate 24. Multiple buses may be used to spread current into the second field plate 74 while not covering too much of the active region such that unwanted capacitance is introduced.

After formation of the second field plate 74, the structure may be covered with a dielectric passivation layer (not shown), such as silicon nitride. Silicon nitride dielectric passivation may be formed, for example, as described in U.S. Pat. No. 6,586,761 to Wu et al. entitled "Group III Nitride Based FETS And HEMTS With Reduced Trapping And Method For Producing The Same", the disclosure of which is incorporated herein by reference as if fully set forth herein.

A multiple field plate arrangement can reduce the peak electric field in the device, which may result in increased breakdown voltage and reduced trapping. When arranged as described above, the shielding effect of multiple field plates including a source-connected field plate can reduce gate-to-drain capacitance of a transistor device, which may enhance input-output isolation.

The field plate can reshape the distribution of the electric field on the drain side of the gate edge and to reduce its peak value. This not only increases device breakdown voltage but also reduces the high-field trapping effect, hence enhancing current-voltage swings at high frequencies. The trade-off of the field plate structure including a gate-connected field plate includes addition of the gate-drain capacitance at low voltages and extension of the gate-drain depletion length at high voltages, which may reduce the gain of the device. However, some embodiments of the invention may provide wide bandgap field effect transistors having field plates which have a desirably high gain.

The thickness of the first spacer layer 62 affects the onset voltage for additional channel depletion under the first field plate 64 while the field-plate length ($L_{FD1}+L_{FD2}$) affects the size of the field-reshaping region. To maintain good frequency performance, a basic design guideline may be to limit the addition of capacitance by the field plate to 10-15% of the original gate capacitance. The separation between the second field plate 74 and the drain ($L_{GD}-L_{FD1}-L_{FD2}$) may be set to >2 μm to avoid premature breakdown. The gate to source distance $L_{GS}$ may be about 1 μm.

The second field plate 74 may be formed by electron beam evaporation, and may have a composition similar to that of the first field plate 64. That is, the second field plate 74 may include a Ni/Au structure having a layer of nickel about 50-500 nm thick and a layer of gold about 100-1000 nm thick. In particular embodiments, the second field plate 74 may include about 20 nm of nickel and about 450 nm of gold.

A third transistor structure 300 is illustrated in FIG. 3. As with the second transistor structure 200 shown in FIG. 2, the third transistor structure 300 has a dual field plate structure. However, as illustrated in FIG. 3, the third transistor structure 300 has a first field plate 364 that is not formed integral with the gate 24. Rather, the first spacer layer 362 is formed to cover the barrier layer 18 and the gate 24, and the first field plate 364 is formed on the first spacer layer 362. A second spacer layer 372 covers the first spacer layer 362 and the first field plate 364, and a second field plate 374 is formed on the second spacer layer 372. The second field plate may extend towards both the source contact 20 and the drain contact 22 (i.e., $L_{FS2}>0$ and $L_{FD2}>0$).

The first spacer layer 362 and the second spacer layer 372 may be formed of a similar material as the first spacer layer 62 and the second spacer layer 72 as described above, and the first field plate 372 and the second field plate 374 may be formed of the a similar material as the second field plate 74 as described above.

The first field plate 364 and/or the second field plate 374 may be electrically connected to the source contact 20 or to the gate contact 24.

In some cases, the second device structure 200 may have improved stability and/or reliability compared to the third device structure 300.

Except as described herein, the epi-structure and processing steps for fabricating the exemplary devices may be carried out using conventional fabrication techniques, such as those described in Wu et al., IEDM Tech Dig., Dec. 2-5, 2001, pp. 378-380, the disclosure of which is incorporated herein by reference as if set forth in its entirety.

EXAMPLE DEVICES

A first exemplary device having a single field plate structure includes a high purity semi-insulating SiC substrate 12. An AlN buffer layer 14 is formed on the substrate 12 and has a thickness of about 200 nm. A GaN first channel sublayer 16A is provided on the buffer layer 12 and has a thickness of about 0.8 µm. The first channel sublayer 16A is doped with Fe at a concentration of about $1\times10^{18}/cm^3$. A GaN second channel sublayer 16B having a thickness of about 0.8 µm is formed on the first channel sublayer 16A. The second channel sublayer 16B is unintentionally doped, but has a residual concentration of Fe dopants therein that decreases with distance from the first channel sublayer 16A.

A first barrier sublayer 18A is provided on the second channel sublayer 16B. The first barrier layer is formed of AlN and has a thickness of about 0.8 nm. A second barrier layer 18B, including AlGaN with about 25% Al, is provided on the first barrier sublayer 18A and has a thickness of about 25 nm.

A first spacer layer 62 formed of $Si_3N_4$ is provided on the second barrier sublayer 18B and has a thickness of about 200 nm.

Source and drain contacts 20 and 22 extend through the first and second barrier layers 18A, 18B and are comprised of Ti/Al/Ni/Au having respective thicknesses of about 10 nm/120 nm/30 nm/50 nm for a total thickness of about 220 nm. The gate contact 24 is also provided on the second barrier sublayer 18B and is Ni/Au with a total thickness of about 470 nm (20 nm Ni/450 nm Au). The first field plate 64 is provided on the first spacer layer 62 and has the same composition as the gate 24. Furthermore, $L_G$ is 0.55 µm, $L_{FS}$ is 0.3 µm, and $L_{FD1}$ is 1 µm.

A second exemplary device having a dual field plate structure has the same structure as the first exemplary device, except that in the second exemplary device, $L_{FD1}$ is 0.5 µm, and the thickness of the first spacer layer 62 is about 100 nm. The second exemplary structure further includes a second $Si_3N_4$ spacer layer 72 having a thickness of about 100 nm on the first field plate 64 and the first spacer layer 62. A second field plate 74 overlaps the gate and extends toward the drain contact 22 by a distance $L_{FD2}$ of about 1.2 µm, and the total length of the first and second field plates 64, 74 is about 1.7 µm. The second field plate 74 is electrically connected to the source contact.

The second exemplary structure has a gate width of 246 µm.

Figure 4:
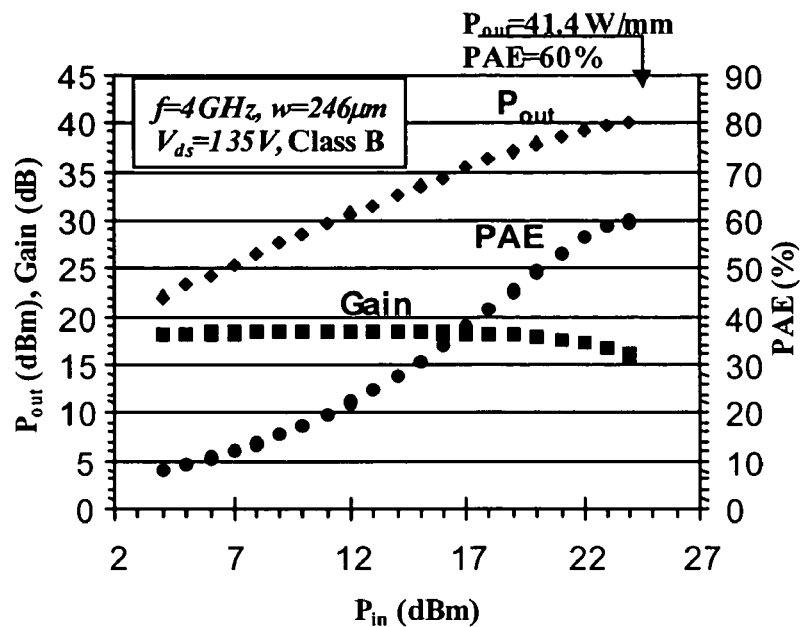
FIG. 4 is a power sweep graph at 4 GHz for 246-µm-wide devices showing 40 W/mm power density and 60% power added efficiency (PAE) when biased at 135 V. Linear gain is 18.5 dB and associated large-signal gain is 16 dB.
Figure 5:
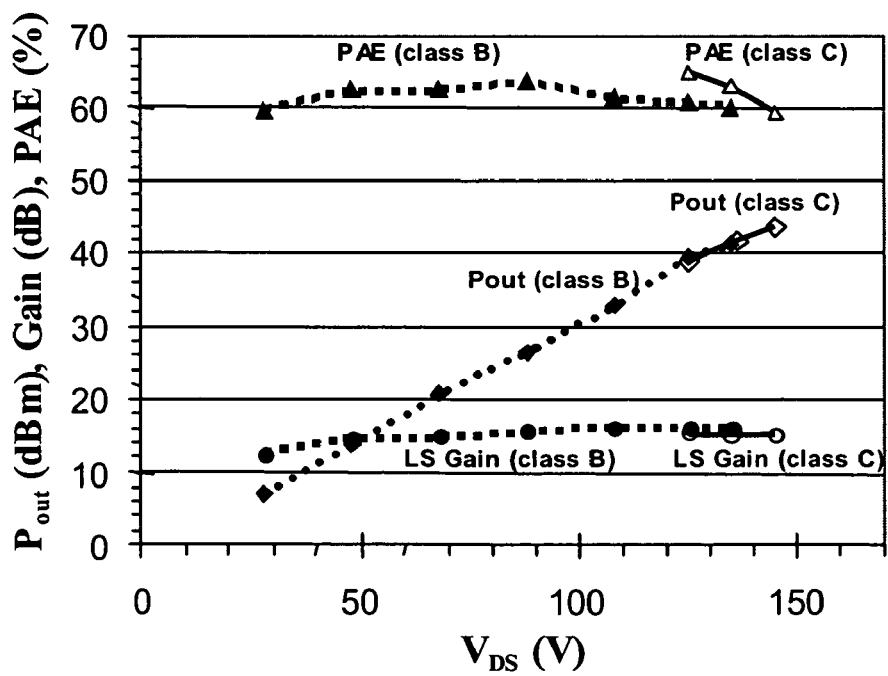
FIG. 5 is a graph at 4 GHz for 246-µm-wide devices of Pout, Gain and PAE versus drain-to-source voltage $V_{DS}$ showing results at different bias classes.

Performance of exemplary devices as described herein will now be described. Unless indicated otherwise, the devices discussed below with reference to FIGS. 4 and 5 are devices having the second exemplary structure described above. However, embodiments of the present invention should not be construed as limited to these particular devices but includes other devices capable of providing the performance characteristics described herein. Furthermore, while various theories of operation are described herein, embodiments of the present invention should not be construed as limited to a particular theory of operation.

The continuous wave (CW) power sweep at 4 GHz for a device having the second exemplary device structure was measured and the results are shown in FIG. 4. The device was measured on-wafer at room temperature and at class B bias with $V_{DS}$=135V. As seen in FIG. 4, the device achieved in excess of 40 W/mm at an input level of 24 dBm. The associated power added efficiency (PAE) at 4 GHz was 60%, with a linear gain of 18.5 dB (large signal gain 16 dB).

Performance of a device having the second exemplary device structure for different bias classes was measured at 4 GHz, and the results are illustrated in FIG. 5. In FIG. 5, output power $P_{out}$, gain, and PAE are plotted against the drain-to-source voltage, which ranged from 28V to 148 V.

The configuration of the second exemplary device structure may permit higher gain across a range of frequencies. For example, the high gain for the configuration also leads to high efficiency, high power operation at 10 GHz (i.e. X-band frequencies). A device similar to the second exemplary device was tested at 10 GHz. The 10 GHz device had the same construction as the second exemplary device, except $L_G$ was 0.5 µm, $L_{FD1}$ was 0.25 µm and $L_{FD2}$ was 0.3 µm.

At 10 GHz, the device exhibited 63% PAE and 5.3 W/mm at $V_{DS}$=28 V (Class C operation), 64% PAE and 7.4 W/mm at $V_{DS}$=38 V (Class C operation), and 62% PAE and 10.8 W/mm at $V_{DS}$=48 V (Class C operation).

Accordingly, some embodiments of the invention may provide improved power performance for wide bandgap field effect transistors at RF, microwave and/or millimeter wave frequencies. Some embodiments of the invention may provide high efficiency, high power and/or high gain operation, and/or more stable operation due to higher input-output isolation (i.e. decreased gate to drain capacitance $C_{GD}$).

While embodiments of the invention have been described in connection with high frequency (>1 GHz) operation, some embodiments of the invention may be implemented with larger dimensions for high voltage applications at lower frequencies.

In the drawings and specification, there have been disclosed typical embodiments of the invention, and, although specific terms have been employed, they have been used in a generic and descriptive sense only and not for purposes of limitation.

That which is claimed is:

1. A field effect transistor, comprising:
 a Group III-nitride channel layer;
 a gate contact on the Group III-nitride channel layer and configured to modulate a conductivity of the channel layer when a voltage is applied to the gate contact, the gate contact having a length configured to permit modulation of the conductivity of the channel layer at frequencies exceeding 1 GHz;
 source and drain contacts on the Group III-nitride channel layer;
 an insulating layer on the gate contact; and
 a field plate on the insulating layer and electrically coupled to the source contact, wherein the field effect transistor exhibits a power density of greater than 40 W/mm under continuous wave or pulsed operation at a frequency of at least 4 GHz.

2. The field effect transistor of claim 1, further comprising a Group III-nitride barrier layer on the channel layer, wherein the gate contact is on the barrier layer, and the barrier layer and the channel layer cooperatively induce a two-dimensional electron gas in the channel layer near an interface between the barrier layer and the channel layer.

3. The field effect transistor of claim 2, wherein the barrier layer comprises a first barrier sublayer on the channel layer and a second barrier sublayer on the first barrier sublayer, the first barrier sublayer comprising AlN and the second barrier sublayer comprising $Al_xGa_{1-x}N$, wherein $0.15 \leq x \leq 0.45$.

4. The field effect transistor of claim 3, wherein the first barrier sublayer has a thickness of about 0 to about 4 nm and the second barrier sublayer has a thickness of about 10 to about 50 nm.

5. The field effect transistor of claim 1, wherein the channel layer comprises a first channel sublayer and a second channel sublayer on the first channel sublayer, the first channel sublayer comprising GaN and having a concentration of Fe dopants of at least about $1\times10^{17}/cm^3$, the second channel sublayer comprising GaN and having a concentration of Fe dopants therein that decreases with distance from the first channel sublayer.

6. The field effect transistor of claim 1, wherein the field plate comprises an upper field plate, the field effect transistor further comprising:
a spacer layer on the barrier layer; and
a lower field plate electrically connected to the gate and extending across the spacer layer from a drain side of the gate contact toward the drain contact by a distance $L_{FD1}$, wherein the upper field plate extends from a drain side edge of the lower field plate towards the drain contact by a distance $L_{FD2}$, and wherein $L_{FD1}+L_{FD2}$ is about 1.0-2.5 µm.

7. The field effect transistor of claim 6, wherein $L_{FD1}$ is about 0.5 µm and $L_{FD2}$ is about 1.2 µm.

8. The field effect transistor of claim 6, wherein the lower field plate also extends across the spacer layer toward the source contact by a distance of from about 0 µm to about 0.5 µm.

9. The field effect transistor of claim 6, wherein the spacer layer comprises SiN.

10. The field effect transistor of claim 1, wherein the power density of at least 40 W/mm is provided at a drain voltage of 135 V.

11. The field effect transistor of claim 1, wherein the field effect transistor has a power added efficiency greater than 50%.

12. A field effect transistor having a power density of greater than 40 W/mm under continuous wave or pulsed operation at a frequency of at least 4 GHz.

13. The field effect transistor of claim 12, wherein the power density of at least 40 W/mm is provided at a drain voltage of 135 V.

14. The field effect transistor of claim 12, wherein the field effect transistor has a power added efficiency greater than 50%.

15. A field effect transistor, comprising:
a Group III-nitride channel layer;
a gate contact on the Group III-nitride channel layer and configured to modulate a conductivity of the channel layer when a voltage is applied to the gate contact, the gate contact having a length configured to permit modulation of the conductivity of the channel layer at frequencies exceeding 1 GHz;
source and drain contacts on the Group III-nitride channel layer;
an insulating layer on the gate contact; and
a field plate on the insulating layer and electrically coupled to the source contact, wherein the field effect transistor exhibits a power density of greater than 5 W/mm and power added efficiency greater than 60% under continuous wave or pulsed operation at a frequency of at least 10 GHz.

16. The field effect transistor of claim 15, further comprising a Group III-nitride barrier layer on the channel layer, wherein the gate contact is on the barrier layer, and the barrier layer and the channel layer cooperatively induce a two-dimensional electron gas in the channel layer near an interface between the barrier layer and the channel layer.

17. The field effect transistor of claim 16, wherein the barrier layer comprises a first barrier sublayer on the channel layer and a second barrier sublayer on the first barrier sublayer, the first barrier sublayer comprising AlN and the second barrier sublayer comprising $Al_xGa_{1-x}N$, wherein $0.15 \leq x \leq 0.45$.

18. The field effect transistor of claim 17, wherein the first barrier sublayer has a thickness of about 0 to about 4 nm and the second barrier sublayer has a thickness of about 10 to about 50 nm.

19. The field effect transistor of claim 15, wherein the channel layer comprises a first channel sublayer and a second channel sublayer on the first channel sublayer, the first channel sublayer comprising GaN and having a concentration of Fe dopants of at least about $1\times10^{17}/cm^3$, the second channel sublayer comprising GaN and having a concentration of Fe dopants therein that decreases with distance from the first channel sublayer.

20. The field effect transistor of claim 15, wherein the field plate comprises an upper field plate, the field effect transistor further comprising:
a spacer layer on the barrier layer; and
a lower field plate electrically connected to the gate and extending across the spacer layer from a drain side edge of the gate contact toward the drain contact by a distance $L_{FD1}$, wherein the upper field plate extends from a drain side edge of the lower field plate towards the drain contact by a distance $L_{FD2}$, and wherein $L_{FD1}+L_{FD2}$ is about 0.3-1.0 µm.

21. The field effect transistor of claim 20, wherein $L_{FD1}$ is about 0.25 µm and $L_{FD2}$ is about 0.3 µm.

22. The field effect transistor of claim 20, wherein the lower field plate also extends across the spacer layer toward the source contact by a distance of from about 0 µm to about 0.5 µm.

23. The field effect transistor of claim 20, wherein the spacer layer comprises SiN.

24. A field effect transistor having a power density of greater than 5 W/mm and a power added efficiency greater than 60% when operated under continuous wave or pulsed operation in Class C mode at a frequency of at least 10 GHz.

25. The field effect transistor of claim 24, wherein the power density of greater than 5 W/mm is provided at a drain voltage of at least 28 V.

26. The field effect transistor of claim 24, wherein the field effect transistor has a power density of greater than 7 W/mm when operated in Class C mode at a frequency of at least 10 GHz.

27. The field effect transistor of claim 26, wherein the power density of greater than 7 W/mm is provided at a drain voltage of at least 38 V.

28. The field effect transistor of claim 24, wherein the field effect transistor has a power density of greater than 10 W/mm when operated in Class C mode at a frequency of at least 10 GHz.

29. The field effect transistor of claim 28, wherein the power density of greater than 10 W/mm is provided at a drain voltage of at least 48 V.

* * * * *